United States Patent [19]
Gonzalez

[11] Patent Number: 5,640,342
[45] Date of Patent: Jun. 17, 1997

[54] STRUCTURE FOR CROSS COUPLED THIN FILM TRANSISTORS AND STATIC RANDOM ACCESS MEMORY CELL

[75] Inventor: Fernando Gonzalez, Boise, Id.

[73] Assignee: Micron Technology, Inc., Boise, Id.

[21] Appl. No.: 561,131

[22] Filed: Nov. 20, 1995

[51] Int. Cl.$^6$ ............................................. G11C 11/00
[52] U.S. Cl. ............................................. 365/156; 257/903
[58] Field of Search ............................. 365/154, 156; 257/67, 351, 903, 385

[56] References Cited

U.S. PATENT DOCUMENTS 5,278,459  1/1994  Matsui et al. ................. 257/903 X
5,440,508  8/1995  Pathak et al. ...................... 365/154

Primary Examiner—Joseph A. Popek
Attorney, Agent, or Firm—Ormiston Korfanta Dunbar & Holland

[57] ABSTRACT

A pair of thin film transistors formed in adjacent layers of polysilicon. The gate of the first TFT and the source, drain and channel regions of the second TFT are formed in the first polysilicon layer. The source, drain and channel regions of the first TFT and the gate of the second TFT are formed in the second polysilicon layer. A dielectric layer is interposed between the first and second polysilicon layers. The first TFT gate overlaps the second TFT drain region in the first polysilicon layer and the second TFT gate overlaps the first TFT drain region in the second polysilicon layer. In another aspect of the invention, two TFTs are incorporated into a SRAM memory cell. The memory cell includes: (i) a bit line; (ii) an access transistor having a first source/drain and a second source/drain, the first source/drain being electrically connected to the bit line; (iii) a parasitic diode formed between the second source/drain of the access transistor and the substrate; (iv) a pull down transistor having a source, drain, channel and gate; (v) a first TFT having a source, drain, channel and gate, the first TFT gate being coupled to a power supply voltage $V_{cc}$ through an active load device comprising a second TFT having a source, drain, channel and gate, and to a voltage not greater than ground through the pull down transistor; and (vi) a storage node for storing a high voltage representative of a first digital data state or a low voltage representative of a second digital state, the storage node being coupled to the bit line through the access transistor, to the substrate through the parasitic diode, to the pull down transistor gate and to the power supply voltage $V_{cc}$ through the first TFT.

15 Claims, 8 Drawing Sheets

STRUCTURE FOR CROSS COUPLED THIN FILM TRANSISTORS AND STATIC RANDOM ACCESS MEMORY CELL

FIELD OF THE INVENTION

The invention relates to semiconductor devices fabricated as integrated circuits and, more particularly, to a structure for cross coupled thin film transistors and a static random access memory (SRAM) cell.

BACKGROUND OF THE INVENTION

Static random access memories (SRAMs) are sometimes used in preference to dynamic random access memories (DRAMs) because SRAMs have faster access times, they require no refresh circuitry and they can be made to have very low power consumption. However, conventional SRAMs are more expensive than DRAMs because an SRAM uses a large number of transistors compared to a DRAM. Hence, DRAMs are preferred in applications where the cost per bit of memory is important.

There are two types of SRAM memory cells in general use today—a six transistor (6T) cell and a four transistor (4T) cell. A typical 6T cell, illustrated in FIG. 1, consists of a latch made up of two cross coupled CMOS inverters, which form a circuit known as a flip-flop. In this cell, the load devices Q3 and Q4 are p-channel transistors. The pull down transistors, Q5 and Q6, and the access transistors, Q1 and Q2, are n-channel transistors. (The term "pull down" derives from the fact that the output nodes of these transistors are pulled down to substantially ground potential when the transistors are biased to conduction.) The first access transistor Q1, the gate of which is controlled by word line WL, provides selective coupling of the true bit line D to storage node A. A second access transistor Q2, the gate of which is also controlled by word line WL, provides selective coupling of the complement bit line D' to storage node B. Since very little power is required to maintain a latched state, 6T SRAMs are often used for memory in battery applications. 6T SRAMs are the most costly SRAMs to manufacture because the 6T cell uses the greatest amount of chip real estate.

A typical 4T SRAM cell, illustrated in FIG. 2, is similar to the 6T cell of FIG. 1 except that the two p-channel load transistors are replaced by resistive elements, R3 and R4. A 4T SRAM is usually less costly to produce than a 6T SRAM because more memory cells can be packed onto each chip. 4T SRAMs are, however, disadvantageous in very low power applications because the resistors consume more current than the p-channel transistors they replace.

In order to overcome the above problems associated with conventional SRAMs, a three transistor (3T) SRAM memory cell was developed. This new SRAM memory cell is described and claimed in my commonly owned and copending application Ser. No. 08/388,873, entitled "Three Transistor Static Random Access Memory Cell", filed Feb. 14, 1995, incorporated herein by reference. The preferred embodiment of the 3T SRAM described in detail in this copending application combines a DRAM memory cell with a half latch. That SRAM memory cell circuitry includes an access transistor coupled to a capacitor, an n-channel pull down transistor and a p-channel thin film transistor (TFT) which acts as the capacitor pull up device. The gate of the TFT is formed in the same layer of polysilicon in which the capacitor storage node is formed. The source, drain and channel of the p-channel TFT is formed in a separate layer of polysilicon. The gate of the TFT is coupled to the supply voltage $V_{cc}$ through back to back diodes, which function as a resistor, and to ground or a substrate voltage through the pull down transistor.

The present invention is directed to a set of cross coupled thin film transistors that are formed on top of one another in vertically adjacent layers of polysilicon. This structural configuration saves valuable chip real estate and, correspondingly, allows for reduced manufacturing costs. When used in the memory cell described in my copending application, the first TFT functions as the capacitor pull up device and the second TFT functions as an active load device in place of the back to back diodes described as part of the preferred embodiment in my copending application. Using a TFT instead of back to back diodes as the load device increases the speed of read and write operations in the SRAM. The invented TFT cross coupling structure allows this increase in speed without adding to cell size.

SUMMARY OF THE INVENTION

Accordingly, it is one object of the invention to provide a new compact structural configuration for a pair of cross coupled TFTs.

It is another object to incorporate this structure into an SRAM memory cell to increase the speed of cell operations without adding to cell size.

It is another object to provide a compact 4T SRAM memory cell circuit, layout and structure.

These and other objects and advantages are achieved by a pair of thin film transistors formed in adjacent layers of polysilicon. The gate of the first TFT and the source, drain and channel regions of the second TFT are formed in the first polysilicon layer. The source, drain and channel regions of the first TFT and the gate of the second TFT are formed in the second polysilicon layer. A dielectric layer is interposed between the first and second polysilicon layers. In one preferred version of the invention, the first TFT gate overlaps the second TFT drain region in the first polysilicon layer and the second TFT gate overlaps the first TFT drain region in the second polysilicon layer.

In another aspect of the invention, two TFTs are incorporated into a SRAM memory cell. The memory cell includes: (i) a bit line; (ii) an access transistor having a first source/drain and a second source/drain, the first source/drain being electrically connected to the bit line; (iii) a parasitic diode formed between the second source/drain of the access transistor and the substrate; (iv) a pull down transistor having a source, drain, channel and gate; (v) a first TFT having a source, drain, channel and gate, the first TFT gate being coupled to a power supply voltage $V_{cc}$ through an active load device comprising a second TFT having a source, drain, channel and gate, and to a voltage not greater than ground through the pull down transistor; and (vi) a storage node for storing a high voltage representative of a first digital data state or a low voltage representative of a second digital state, the storage node being coupled to the bit line through the access transistor, to the substrate through the parasitic diode, to the pull down transistor gate and to the power supply voltage $V_{cc}$ through the first TFT. In one preferred version of the SRAM memory cell, the first TFT gate is formed in a first polysilicon layer and the first TFT source, drain and channel are formed in a second polysilicon layer, the second polysilicon layer being disposed over and adjacent to the first polysilicon layer. The second TFT gate is formed in the second polysilicon layer and the second TFT source, drain and channel are formed in the first polysilicon layer. A dielectric layer is interposed between the first and second polysilicon layers. Preferably, the first TFT gate overlaps the second TFT source and the second TFT gate overlaps the first TFT source.

BRIEF DESCRIPTION OF THE DRAWINGS

FIGS. 5-10 are idealized representations used to depict the structure of the invention and the process steps used to form that structure. These figures are not meant to be actual views of an SRAM memory cell.

DETAILED DESCRIPTION OF THE INVENTION

Figure 1:
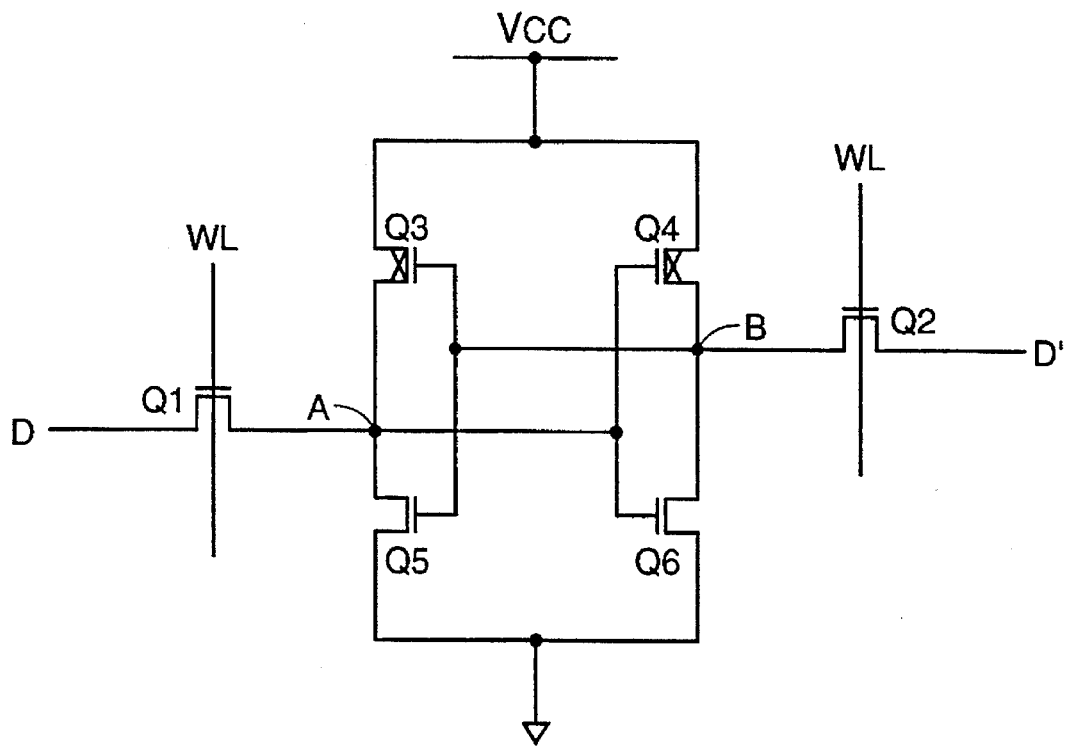
FIG. 1 is a schematic circuit diagram of a conventional 6T SRAM memory cell.
Figure 2:
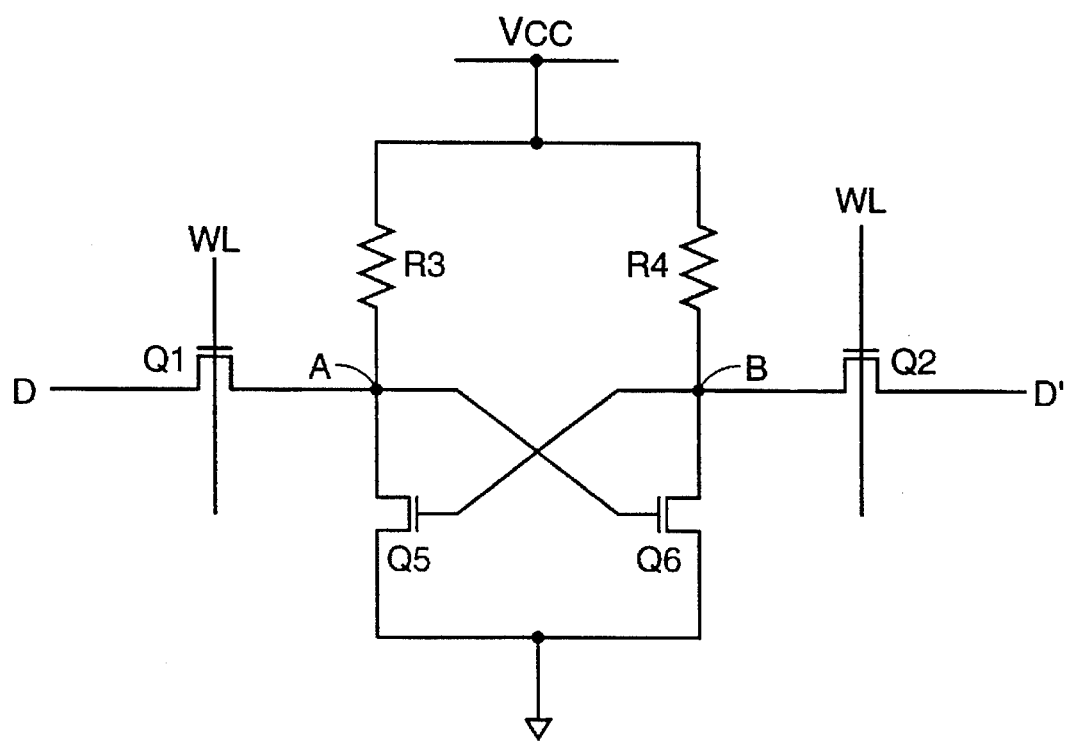
FIG. 2 is a schematic circuit diagram of a conventional 4T SRAM memory cells.
Figure 3:
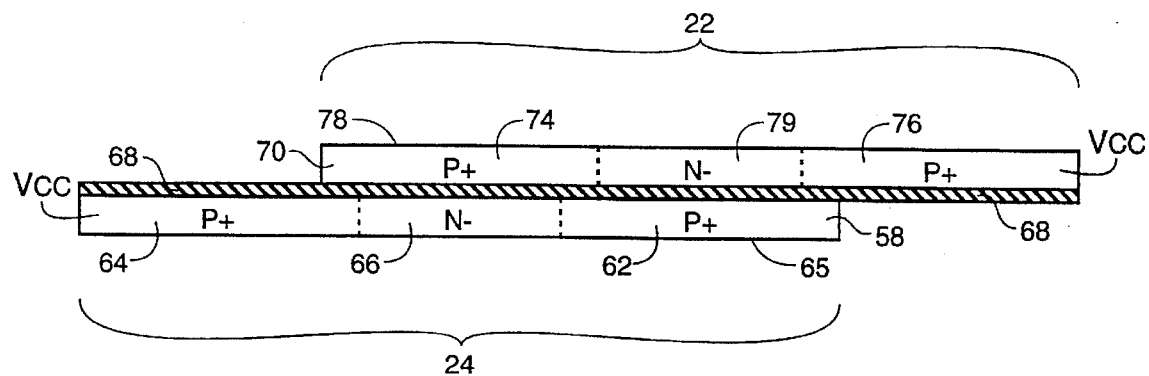
FIG. 3 is a cross section view illustrating the invented structural configuration of a pair of TFTs formed one on top of the other in vertically adjacent layers of polysilicon.

Referring first to FIG. 3, a pair of cross coupled thin film transistors (TFTs) 22, 24 are formed one on top of the other in vertically adjacent layers of polysilicon 58, 70. First layer of polysilicon 58 is deposited over a substrate structure and lightly doped with an n-type impurity such as phosphorus, arsenic or antimony. The source, drain and channel regions of the second TFT 24, and the gate of the first TFT 22 will be formed in first polysilicon layer 58. The structure is then masked with an implant mask and the mask is patterned to expose first polysilicon layer 58 at the location of the source and drain for the second TFT 24 and the gate for the first TFT 22. The exposed portions of first polysilicon layer 58 are heavily doped with a p-type impurity to form p+ drain region 62 and p+ source region 64 of second TFT 24. Drain region 62 of second TFT 24 also functions as the gate 65 of first TFT 22. These implants also define the n-channel region 66 of second TFT 24.

A dielectric layer 68 is formed over first polysilicon layer 44. Dielectric layer 68 consists of an oxide/nitride or oxide/nitride/oxide ("ONO") film stack or a conventional gate material. A second layer of polysilicon 70 is then deposited over the dielectric layer 68 and lightly doped with an n-type impurity. The source, drain and channel regions of the first TFT 22, and the gate of the second TFT 24 are formed in second polysilicon layer 68. The array is masked with an implant mask and the mask is patterned to expose second polysilicon layer 70 at the location of the source and drain of the first TFT 22 and the gate of the second TFT 24. The exposed portions of second polysilicon layer 70 are heavily doped with a p-type impurity to form p+ drain region 74 and p+ source region 76 of first TFT 22. These implants define the n-channel region 79 of first TFT 22. Drain region 74 of first TFT also functions as the gate 78 of second TFT 24. First and second TFTs 22, 24 are cross coupled via the overlapping/connecting drains 74, 62 and gates 78, 65. For most conventional applications in which this back to back TFT structural configuration may be used, the respective source regions will be connected to a power supply voltage $V_{cc}$ and the gates will be cross coupled to drains of opposing n-channel transistors.

Figure 4:
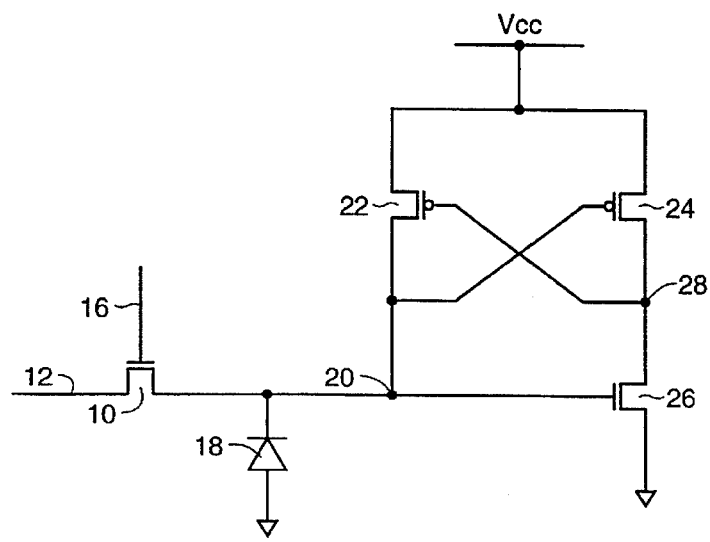
FIG. 4 is a schematic circuit diagram of a 4T SRAM memory cell constructed according to one of the preferred embodiments of the invention.

FIG. 4 is a schematic circuit diagram illustrating a novel 4T SRAM memory cell that uses the invented back to back TFTs. Insulated gate field effect access transistor 10 provides bit line 12 with selective access to storage node 20 when word line 16 is brought to a high potential, typically 3-7 volts. As described in more detail below, storage node 20 preferably consists of the parasitic capacitance inherent in the storage node polysilicon. Alternatively, storage node 20 may be formed as a conventional DRAM "stacked" capacitor. As in a conventional DRAM memory cell, the charge on the storage node 20 leaks through a parasitic diode 18 formed at the junction of the storage node 20 and the substrate. The source of first thin film transistor (TFT) 22 is electrically connected to the supply voltage $V_{cc}$. The drain of first TFT 22 is electrically connected to storage node 20. The gate of first TFT 22 is electrically connected to $V_{cc}$ through second TFT 24 and to ground through an insulated gate field effect pull down transistor 26. The drain of pull down transistor 26 is electrically connected to $V_{cc}$ through second TFT 24, which serves as the active load for the pull down transistor 26. The source of pull down transistor 26 is electrically connected to ground. The gate of pull down transistor 26 is electrically connected to storage node 20.

When access transistor 10 is conductive and bit line 12 charges storage node 20 is to a high voltage (a "1" value), pull down transistor 26 is conductive and control node 28 goes to ground potential. When control node 28 is near ground potential, first TFT is fully conductive and storage node 20 is maintained at a high voltage. The current flow through first TFT 22 must be greater than the current flow through parasitic diode 18 to maintain storage node 20 at a high voltage. Conversely, when storage is at a low voltage (a "0" value), pull down transistor 26 is non-conductive and control node 28 is placed at near $V_{cc}$. When control node 28 is near $V_{cc}$, first TFT 22 is non-conductive and storage node 20 is maintained at a low voltage. Although, first TFT 22 is never fully non-conductive because its channel is formed in a layer of polysilicon, the leakage through first TFT 22 is offset by the leakage through parasitic diode 18 which is set to be greater than the off-state current leakage through first TFT 22 when storage node 20 is discharged. As is well known to those skilled in the art, the leakage of parasitic diode 18 may be controlled by adjusting the doping profile of the storage node junction.

The process steps for fabricating the preferred embodiment of the SRAM memory cell of the present invention will now be described with reference to FIGS. 5-10. FIGS. 6A-10A and 6B-10B are cross section views taken along the lines A-A' and B-B' in FIG. 5, respectively. Each of the cross section views may represent a number of different individual process steps carried out to arrive at the particular structure shown. Since the individual process steps are conventional and well known to those skilled in the art of semiconductor device manufacturing, several of these steps have been combined in the various figures for the sake of simplicity and to better illustrate the preferred embodiment of the invented structures. Also, the fabrication of semiconductor devices includes etching predetermined patterns into layers of various material stacked over the semiconductor substrate. This process is sometimes referred to herein for convenience as "patterning and etching." Photolithography and reactive ion etching, for example, are commonly used pattern and etch processes. These or other pattern and etch processes, well known to those skilled in the art, may be used to implement the present invention.

Figure 6A:
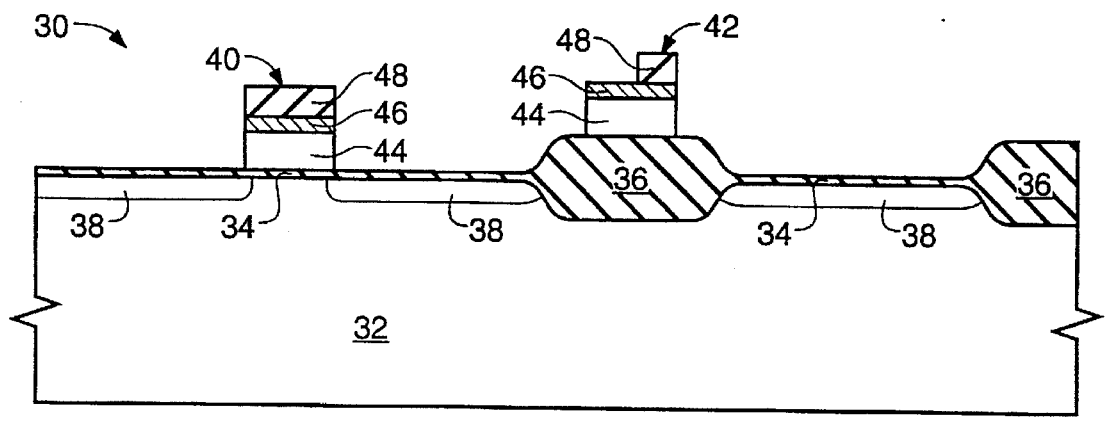
FIGS. 6A, 7A, 8A, 9A and 10A are cross section views taken along the line A-A' in FIG. 5 illustrating sequentially the manufacture of the 4T memory cell of FIGS. 4 and 5.
Figure 6B:
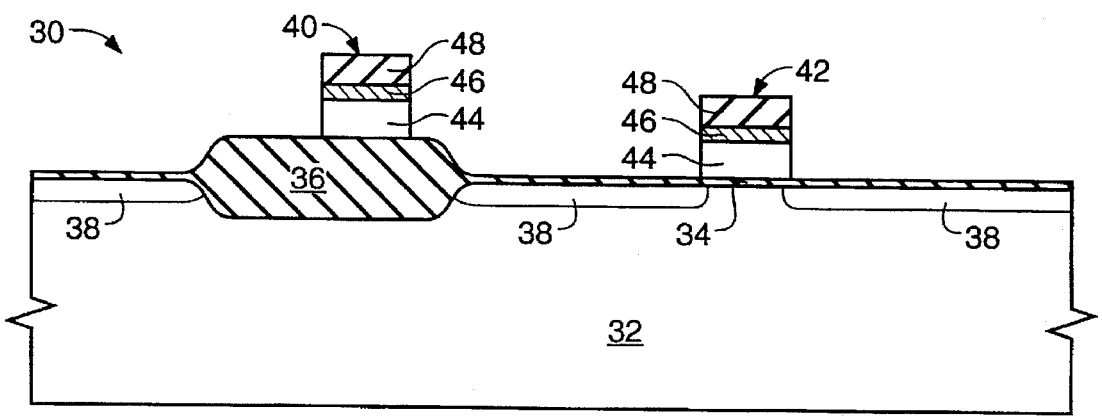
FIGS. 6B, 7B, 8B, 9B and 10B are cross section views taken along the line B-B' in FIG. 5 illustrating sequentially the manufacture of the 4T memory cell of FIGS. 4 and 5.

Referring now to FIGS. 6A and 6B, wafer 30 comprises a lightly doped p-type single crystal silicon substrate 32 which has been oxidized to form thin gate insulating layer 34 and thick field oxide regions 36. Access transistor gate 40 and pull down transistor gate 42 are formed by successively depositing or "stacking" a polysilicon layer 44, a tungsten silicide layer 46 and a silicon dioxide layer 48 over substrate 32, and then patterning and etching those layers to expose substrate 32 at desired locations of the transistor source/drain regions. These layers are deposited, patterned and etched using conventional methods well known in the art. Alternatively, transistor gates 40 and 42 may be formed of a single layer of polysilicon deposited and etched as described above. The tungsten silicide and silicon dioxide layers are included herein merely to better illustrate the details of the preferred embodiment of the invention. Impurities are implanted in the surface of substrate 32 to form n-doped source/drain regions 38 for access transistor 10 and pull down transistor 26. The array is patterned and etched to remove a portion of the oxide layer on top of only the pull down transistor gate 42. This insulating layer is removed from pull down transistor gate 42 so that contact can subsequently be made between gate 42 and storage node 20.

Figure 7A:
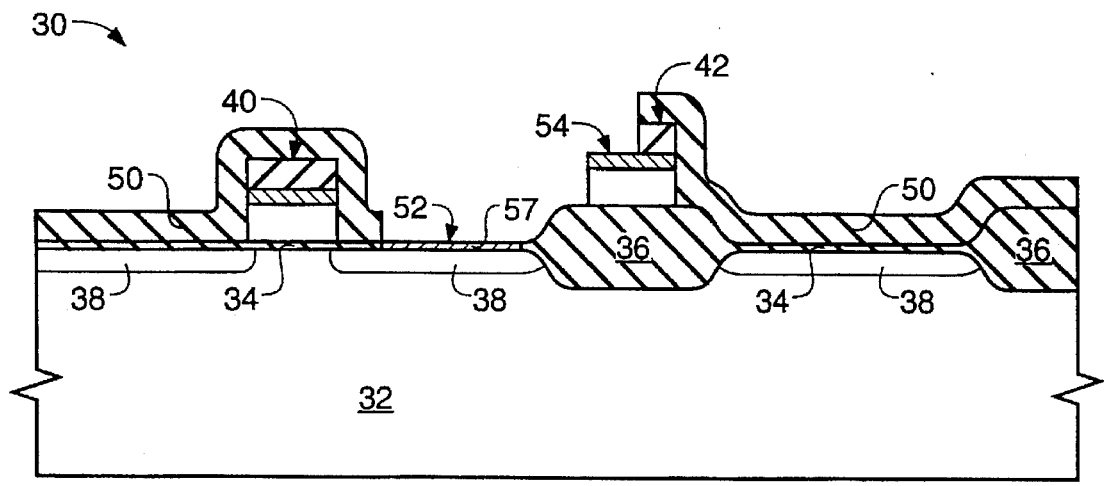
Figure 7B:
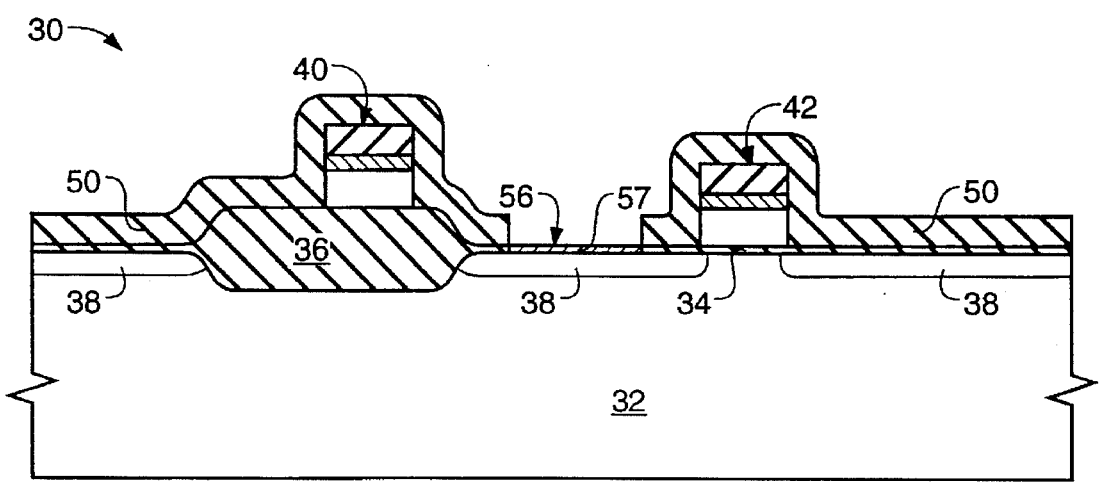

Referring to FIGS. 7A and 7B, isolation oxide layer 50 is formed over the entire array. Isolation oxide layer 50 is then patterned and etched to remove portions of oxide layer 50 from the storage node contact region 52, landing pad 54 on the upper surface of the pull down transistor gate 42, and the pull down transistor drain contact region 56. A thin layer of highly conductive material 57 is then formed over the upper surface of the in process structure and patterned and etched to leave conductive material on the substrate in contact regions 38. Conductive layer 57 will facilitate contact between n-regions 38 in substrate 32 and the subsequently formed p+ storage node polysilicon. Conductive layer 57 preferably consists of a transition refractory metal silicide or transition refractory metal nitride. Example transition metals include tungsten (W), molybdenum (Mo), tantalum (Ta), titanium (Ti), protactinium (Pa), nickel (Ni) and cobalt (Co). The most preferred transition conductive material is titanium nitride (TiN).

Figure 5:
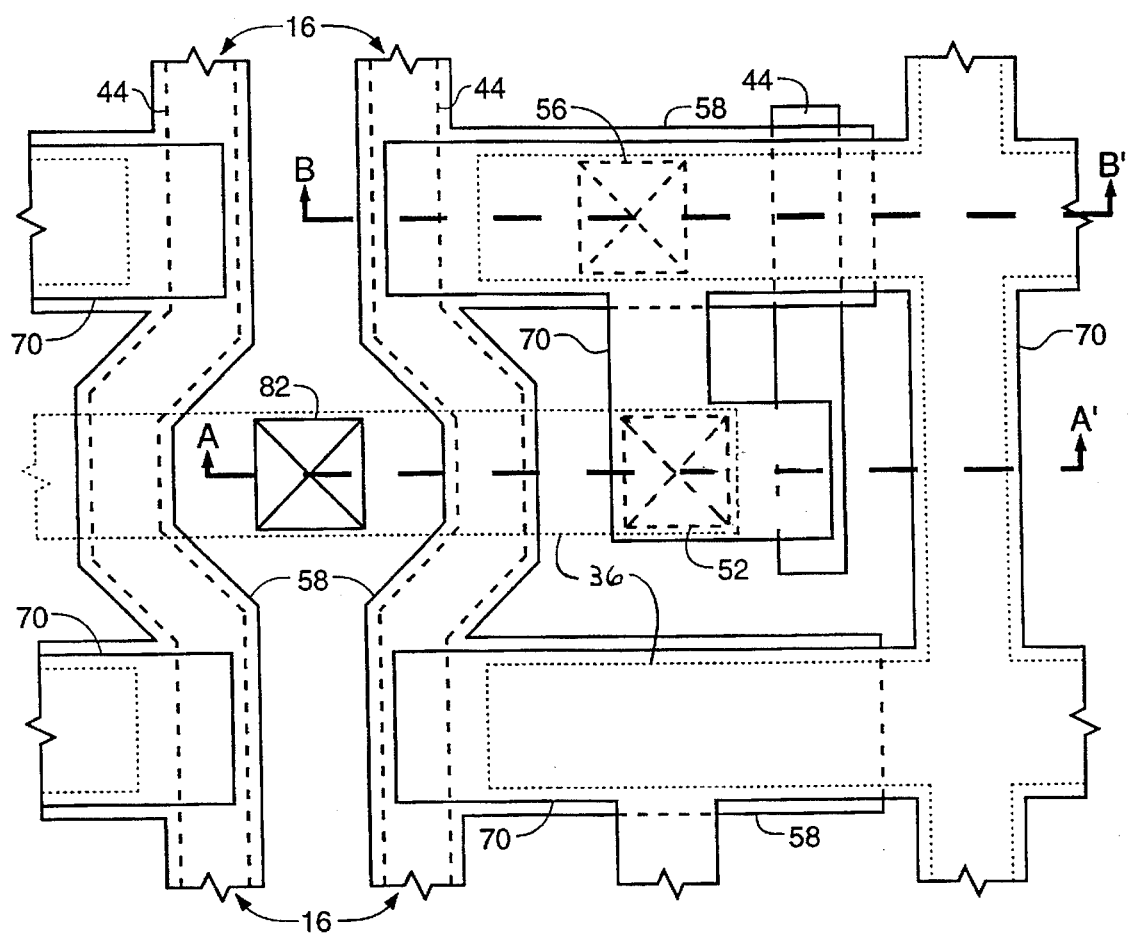
FIG. 5 is a top down plan view illustrating the preferred layout of the 4T cell of FIG. 4.
Figure 8A:
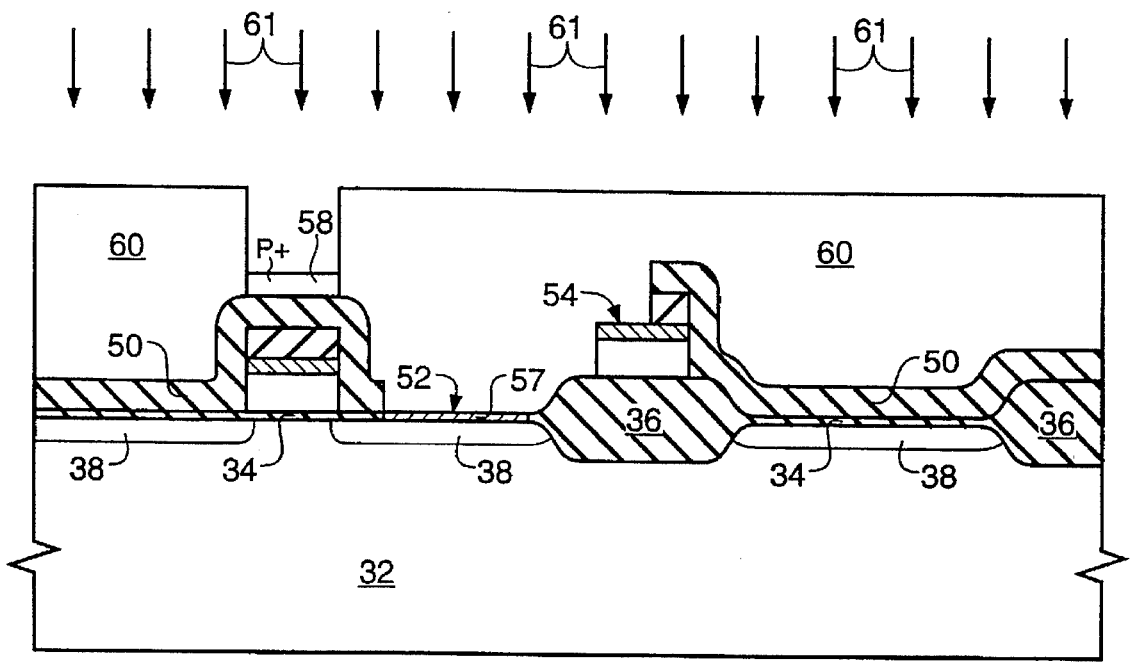
Figure 8B:
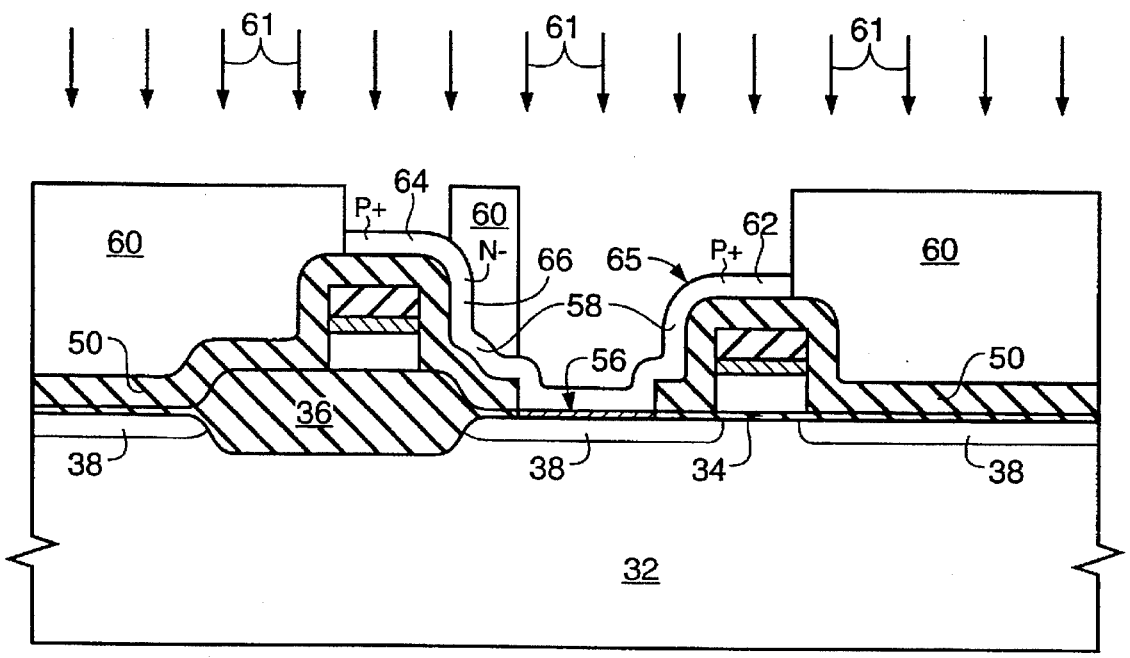

Referring to FIGS. 8A and 8B, a first layer of polysilicon 58 is deposited over the array and lightly doped with an n-type impurity such as phosphorus, antimony or arsenic. First polysilicon layer 58 is patterned and etched to form an "M" (turned on its side) shaped pattern as shown in FIG. 5. The source, drain and channel regions of the second TFT 24, and the gate of the first TFT 22 will be formed in the first polysilicon layer 58. The array is then masked with an implant mask 60 to expose first polysilicon layer 58 at the location of the source and drain for the second TFT 24 and the gate for the first TFT 22. The exposed portions of first polysilicon layer 58 are heavily doped with a p-type impurity, indicated symbolically by implant arrows 61, to form p+ drain region 62 and source region 64 of second TFT 24. Drain region 62 of second TFT 24 also functions as the gate 65 of first TFT 22. These implants also define the n-channel region 66 of second TFT 24. As will be apparent to those skilled in the art, it is preferable that, after implant mask 60 is removed, the array is subjected to a light blanket p-type, peferably boron, implant to achieve the desired characteristics for first TFT gate 65.

Figure 9A:
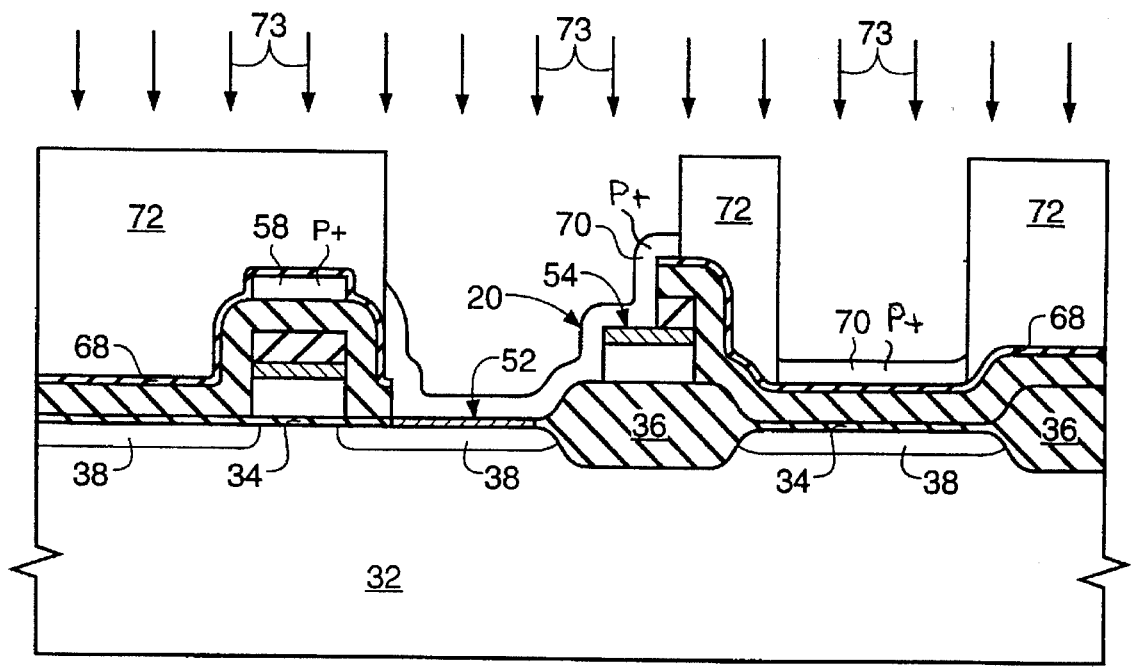
Figure 9B:
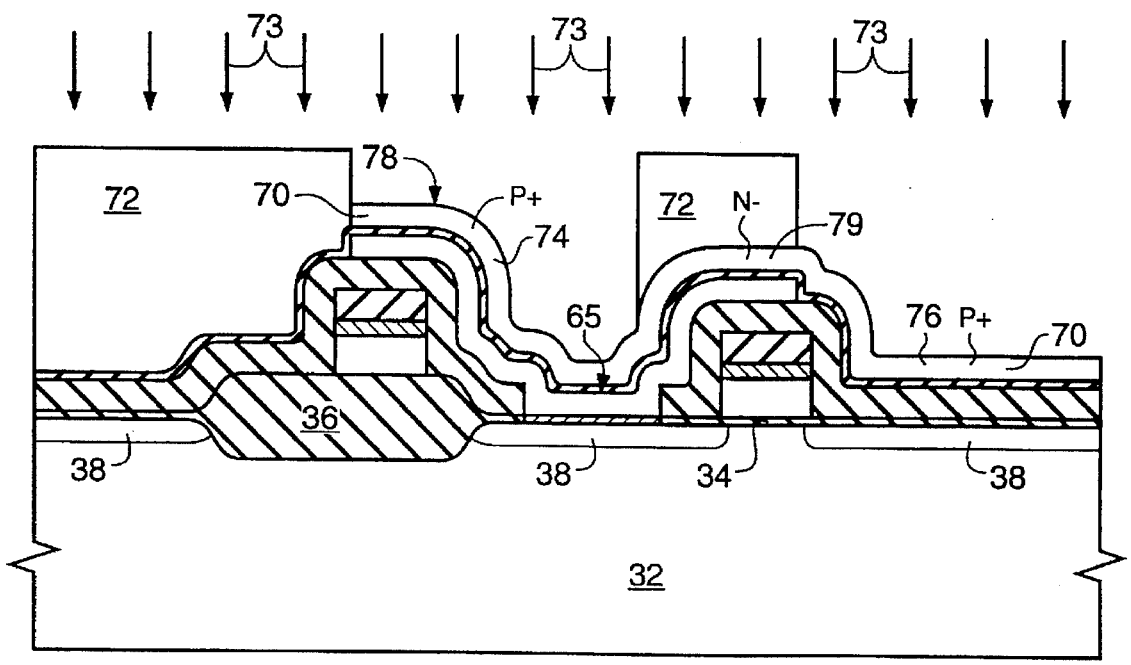

Referring to FIGS. 9A and 9B, a dielectric layer 68 is formed over the array. Dielectric layer 68 consists of an oxide/nitride or oxide/nitride/oxide ("ONO") film stack or a conventional gate material. Dielectric layer 68 is patterned and etched to expose substrate 32 at storage node contact region 52 and to expose landing pad 54 on pull down transistor gate 42. A second layer of polysilicon 70 is then deposited over the array and lightly doped with an n-type impurity. Second polysilicon layer 70 is patterned and etched to form a claw shaped pattern as shown in FIG. 5. The source, drain and channel regions of the first TFT 22, the gate of the second TFT 24, and storage node 20 are formed in second polysilicon layer 68. The array is masked with an implant mask 72 to expose second polysilicon layer 70 at the location of the source and drain of the first TFT 22, the gate of the second TFT 24 and storage node 20. The exposed portions of second polysilicon layer 70 are heavily doped with a p-type impurity, indicated symbolically by implant arrows 73, to form p+ drain region 74, source region 76 of first TFT 22 and storage node 20. These implants define the n-channel region of first TFT 22. Drain region 74 of first TFT also functions as the gate 78 of second TFT 24. Again, as will be apparent to those skilled in the art, it is preferable that, after implant mask 72 is removed, the array is subjected to a light blanket p-type, peferably boron, implant to achieve the desired characteristics for second TFT gate 78. This and other conventional techniques may be used to optimize the TFT sub-threshold voltage characteristics and current drive/gain.

The parasitic capacitance inherent in storage node 20, which constitutes storage node 20, can be made to hold a charge sufficient to maintain a high voltage ("1" value) in the cell. Alternatively, a conventional DRAM stacked capacitor could be used as storage node 20. In that case, the storage node (the capacitor bottom electrode) would be formed in the first polysilicon layer which would extend down to the substrate 32 at storage node contact region 52. The cell plate (the capacitor top electrode) would thereafter be formed in the second polysilicon layer.

Figure 10A:
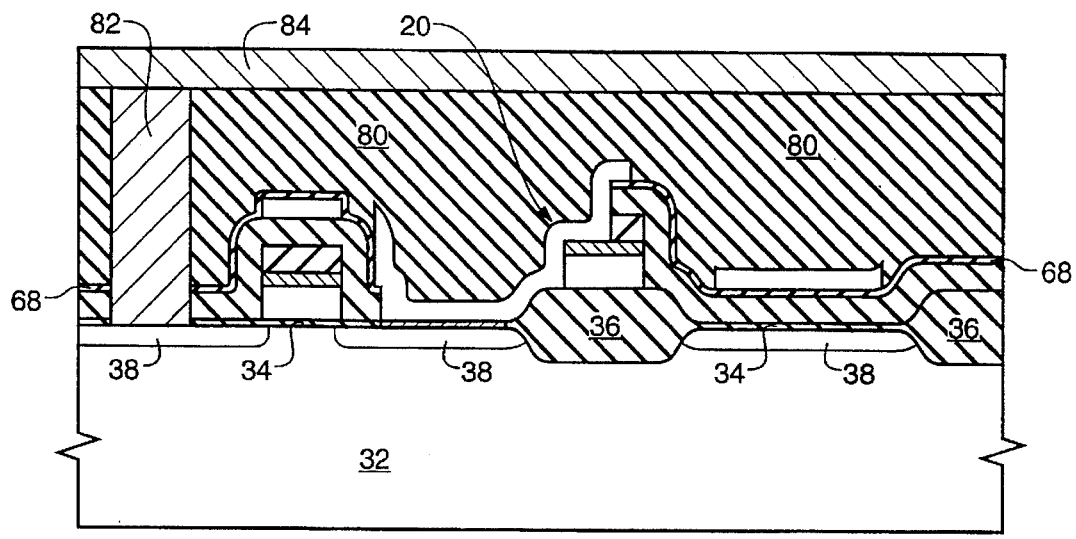
Figure 10B:
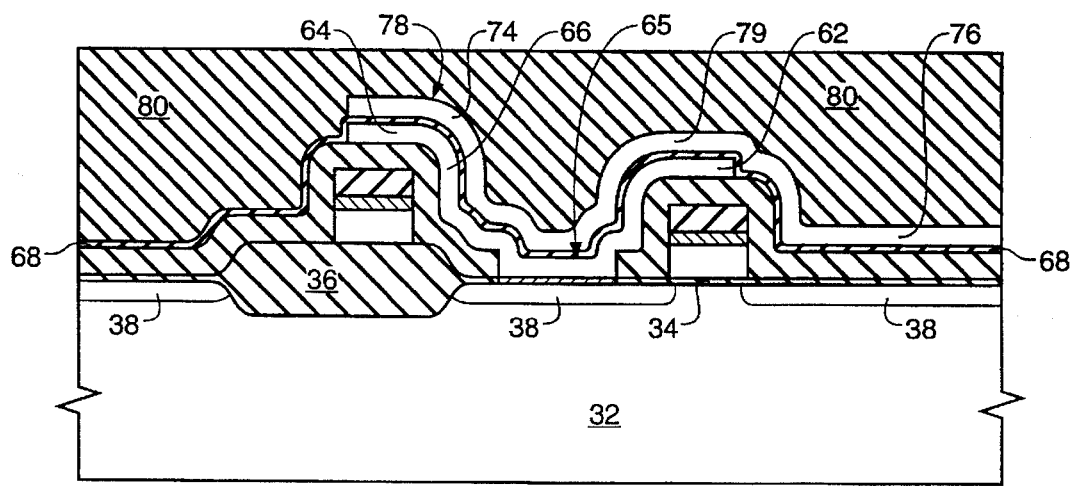

Referring to FIGS. 10A and 10B, a thick upper insulating layer 80 of boro-phospho-silicate glass (BPSG) or other suitable insulating material is formed over the exposed upper surfaces of the structure previously formed. Upper insulating layer 80 is patterned and etched to form a corridor down to substrate 32. Bit line contact 82 and bit line 84 are then formed using metal deposition techniques well known in the art.

There has been shown and described a new structure for cross coupled TFTs and an SRAM memory cell using this new structure. Replacing the back to back diodes with a thin film transistor as the load device increases the speed of read and write operations in the SRAM. The novel configuration and structure of the cross coupled TFTs, wherein both TFTs are formed in two vertically adjacent layers of polysilicon, allows this increase in speed without adding to cell size. The particular embodiments shown in the drawings and described herein are for purposes of example and should not be construed to limit the invention as set forth in the appended claims.

I claim:

1. A semiconductor device, comprising:
    a. a first thin film transistor having a first gate formed in a first polysilicon layer and first source, drain and channel regions formed in a second polysilicon layer, the second polysilicon layer being disposed over and adjacent to the first polysilicon layer;
    b. a second thin film transistor having a second gate formed in the second polysilicon layer and second source, drain, and channel regions formed in the first polysilicon layer; and c. a dielectric layer interposed between the first and second polysilicon layers.

2. A semiconductor device according to claim 1, wherein the first gate overlaps the second drain region.

3. A semiconductor device according to claim 1, wherein the second gate overlaps the first drain region.

4. A semiconductor device according to claim 1, further comprising a supply voltage $V_{cc}$ electrically connected to the first and second source regions.

5. A four transistor SRAM memory cell formed on a semiconductor substrate, comprising:

a. a bit line;

b. an access transistor having a first source/drain and a second source/drain, the first source/drain being electrically connected to the bit line;

c. a parasitic diode formed between the second source/drain of the access transistor and the substrate;

d. a pull down transistor having a source, drain, channel and gate;

e. a first thin film transistor having a source, drain, channel and gate, the first thin film transistor gate being coupled to a power supply voltage through a load device comprising a second thin film transistor having a source, drain, channel and gate, and to a voltage not greater than ground through the pull down transistor; and f. a storage node for storing a high voltage representative of a first digital data state or a low voltage representative of a second digital state, the storage node being coupled to the bit line through the access transistor, to the substrate through the parasitic diode, to the pull down transistor gate and to the power supply voltage through the first thin film transistor.

6. A memory cell according to claim 5, wherein the storage node comprises a parasitic capacitance inherent in a first layer of polysilicon.

7. A memory cell according to claim 5, wherein:

a. the first thin film transistor gate is formed in a first polysilicon layer and the first thin film transistor source, drain and channel are formed in a second polysilicon layer, the first and second polysilicon layers being disposed vertically adjacent to one another;

b. the second film transistor gate is formed in the second polysilicon layer and the second thin film transistor source, drain and channel are formed in the first polysilicon layer; and c. a dielectric layer is interposed between the first and second polysilicon layers.

8. A memory cell according to claim 7, wherein the first thin film transistor gate overlaps the second thin film transistor drain.

9. A memory cell according to claim 7, wherein the second thin film transistor gate overlaps the first thin film transistor drain.

10. A memory cell according to claim 7, wherein the substrate is p-type silicon, the access and pull down transistors are n-channel transistors, and the thin film transistors are p-channel transistors.

11. An SRAM memory cell formed on a semiconductor substrate, comprising:

a. a storage node for storing either a high or a low voltage level representative of a digital data bit;

b. a first thin film transistor coupled to the storage node, the first thin film transistor being configured to maintain the high voltage level on the storage node after the high voltage level is applied to the storage node;

c. a load device comprising a second thin film transistor for switching between isolating the gate of the first thin film transistor from a power supply voltage when the voltage level on the storage node is high and coupling the gate of the first thin film transistor to the power supply voltage when the voltage level on the storage node is low;

d. the first thin film transistor gate is formed in a first polysilicon layer and the first thin film transistor source, drain and channel are formed in a second polysilicon layer, the first and second polysilicon layers being disposed vertically adjacent to one another;

e. the second film transistor gate is formed in the second polysilicon layer and the second thin film transistor source, drain and channel are formed in the first polysilicon layer; and f. a dielectric layer is interposed between the first and second polysilicon layers.

12. A memory cell according to claim 11, wherein the first thin film transistor gate overlaps the second thin film transistor drain.

13. A memory cell according to claim 11, wherein the second thin film transistor gate overlaps the first thin film transistor drain.

14. A memory cell according to claim 11, further comprising an access transistor for selectively coupling the storage node to a bit line so that either one of the voltage levels may be applied to the storage node or so that a voltage level previously applied to the storage node can be ascertained.

15. A memory cell according to claim 11, further comprising a pull down transistor configured to couple the gate of the first thin film transistor to a voltage no greater than ground in response to a high voltage level on the storage node.

* * * * *